United States Patent
Ide et al.

(10) Patent No.: US 10,476,030 B2
(45) Date of Patent: Nov. 12, 2019

(54) DISPLAY DEVICE AND MANUFACTURING METHOD THEREOF

(71) Applicant: Futaba Corporation, Mobara-shi, Chiba (JP)

(72) Inventors: Shinji Ide, Mobara (JP); Takahiro Niiyama, Mobara (JP); Mitsufumi Kodama, Mobara (JP)

(73) Assignee: Futaba Corporation, Mobara-shi, Chiba (JP)

( * ) Notice: Subject to any disclaimer, the term of this patent is extended or adjusted under 35 U.S.C. 154(b) by 0 days.

(21) Appl. No.: 16/003,116

(22) Filed: Jun. 8, 2018

(65) Prior Publication Data
US 2018/0375062 A1  Dec. 27, 2018

(30) Foreign Application Priority Data
Jun. 26, 2017  (JP) .................. 2017-124058

(51) Int. Cl.
*H01L 51/52* (2006.01)
*H01L 51/56* (2006.01)
*H01L 27/32* (2006.01)

(52) U.S. Cl.
CPC ...... *H01L 51/5253* (2013.01); *H01L 27/3283* (2013.01); *H01L 51/5246* (2013.01); *H01L 51/56* (2013.01); *H01L 2251/5392* (2013.01)

(58) Field of Classification Search
CPC combination set(s) only.
See application file for complete search history.

(56) References Cited

U.S. PATENT DOCUMENTS

| | | |
|---|---|---|
| 2002/0015818 A1 | 2/2002 | Takahashi et al. |
| 2004/0004434 A1* | 1/2004 | Nishi ............... H01L 27/322 313/506 |
| 2004/0061118 A1 | 4/2004 | Yamazaki et al. |
| 2009/0261719 A1* | 10/2009 | Nimura ............ H01L 51/5246 313/504 |
| 2011/0063808 A1 | 3/2011 | Chen et al. |
| 2011/0175101 A1* | 7/2011 | Hatano ............ H01L 27/1266 257/72 |

(Continued)

FOREIGN PATENT DOCUMENTS

| | | |
|---|---|---|
| CN | 108511620 | 9/2018 |
| JP | H3-121700 | 12/1991 |

(Continued)

*Primary Examiner* — Mamadou L Diallo
(74) *Attorney, Agent, or Firm* — Soei Patent & Law Firm

(57) ABSTRACT

A display device includes a first substrate, a sealing layer located along an edge of the first substrate, a second substrate coupled with the first substrate via the sealing layer, a display part located on the second main surface and within a sealed space, and a filler filling the sealed space and including a particle solid drying agent dispersed therein. The display part includes an organic EL element located on the second substrate, the organic EL element including a first electrode, an organic EL layer, and a second electrode stacked in order from the second substrate. Additionally, the display part includes an organic sacrifice layer located on and in contact with the second electrode, and a first inorganic protective layer located on and in contact with the organic sacrifice layer. The filler is located between the first inorganic protective layer and the first substrate.

25 Claims, 8 Drawing Sheets

(56) References Cited

U.S. PATENT DOCUMENTS

| | | | |
|---|---|---|---|
| 2014/0299847 A1 | 10/2014 | Sin et al. | |
| 2015/0207098 A1* | 7/2015 | Yasuda | H01L 51/5246 257/40 |
| 2017/0133626 A1* | 5/2017 | Senoo | H01L 51/5203 |
| 2017/0207276 A1* | 7/2017 | Miyamoto | H01L 51/5246 |
| 2017/0256596 A1* | 9/2017 | Hamada | H01L 51/5256 |
| 2017/0280531 A1* | 9/2017 | Tada | H01L 27/3206 |
| 2018/0130972 A1* | 5/2018 | Sonoda | H01L 27/3276 |
| 2018/0301651 A1* | 10/2018 | Kamiya | H01L 51/5012 |

FOREIGN PATENT DOCUMENTS

| | | |
|---|---|---|
| JP | 2004-095503 | 3/2004 |
| JP | 2004-095551 | 3/2004 |
| JP | 2009-245734 | 10/2009 |
| JP | 2014-201574 | 10/2014 |
| JP | 2016-001569 | 1/2016 |
| JP | 2017-004747 | 1/2017 |
| TW | 504944 | 10/2002 |
| TW | 201110281 | 3/2011 |
| WO | 2016/163367 | 10/2016 |

* cited by examiner

DISPLAY DEVICE AND MANUFACTURING METHOD THEREOF

CROSS-REFERENCE TO RELATED APPLICATION

This application claims the benefit of priority of Japanese Patent Application No. 2017-124058, filed Jun. 26, 2017, the entire contents of which are incorporated herein by reference.

TECHNICAL FIELD

An aspect of the present disclosure relates to a display device and a manufacturing method thereof.

BACKGROUND

In recent years, an organic EL display device has been in the focus of attention as a display device which uses an organic EL material (EL: Electro-Luminescence) as a light-emitting material. An organic EL element which is configured to have the organic EL material interposed between a pair of electrodes is likely to be affected by moisture. For example, water in contact with the organic EL element may cause the electrode to be degraded, that is, oxidized or peeled off and so on. Accordingly, a measure is taken for the organic EL display device against water intruding into an area where the organic EL element is provided.

For example, Japanese Unexamined Patent Publication No. 2014-201574 discloses the organic EL display device having a so-called filled sealing structure. In Japanese Unexamined Patent Publication No. 2014-201574, a filler containing a complex compound drying agent is filled in a space sealed by an element substrate and sealing substrate (sealed space). Japanese Unexamined Utility Model Publication No. H3-121700 discloses an inorganic EL display device in which a powdery water-absorbing substance (solid drying agent) is contained in a silicon resin layer.

SUMMARY

If the complex compound drying agent as disclosed in Japanese Unexamined Patent Publication No. 2014-201574 is compared with the powdery (particulate) solid drying agent as disclosed in Japanese Unexamined Utility Model Publication No. H3-121700, the latter tends to exhibit a higher water-capturing property. Accordingly, in view of achieving a prolonged lifetime of the organic EL display device, the organic EL display device may have a filled sealing structure using the filler containing the solid drying agent. However, when such a filler is filled into the sealed space or the like, breakage of the organic EL element may occur due to the solid drying agent. Therefore, if the solid drying agent is used, a yield of the organic EL display device may decrease.

An organic EL display device according to an aspect of the present disclosure comprises a first substrate having a first main surface, a frame-shaped sealing layer provided on the first main surface and along an edge of the first substrate, a second substrate formed into one body with the first substrate via the sealing layer, and having a second main surface facing the first main surface, a display part provided on the second main surface and within a sealed space surrounded and sealed by the first substrate, the sealing layer, and the second substrate, and a filler filling the sealed space and having a particle solid drying agent dispersed therein. The display part may comprise an organic EL element provided on the second main surface and having a first electrode, an organic EL layer, and a second electrode stacked in order from the second main surface, an organic sacrifice layer located on and in contact with the second electrode, and a first inorganic protective layer located on and in contact with the organic sacrifice layer. The filler layered on the organic EL element in a thickness direction of the first substrate is located between the first inorganic protective layer and the first substrate.

By preventing the solid drying agent dispersed in the filler from directly contacting the organic EL element, it is possible to reduce or prevent the solid drying agent damaging the surface of the second electrode. The organic sacrifice layer and the first inorganic protective layer are stacked in order in the thickness direction between the organic EL element and the filler. Therefore, when the solid drying agent presses the first inorganic protective layer, the solid drying agent compresses and deforms the organic sacrifice layer via the first inorganic protective layer. This allows the stress due to the solid drying agent to be relaxed by the organic sacrifice layer, and the organic EL layer is unlikely to be compressed and deformed. In addition, when the solid drying agent moving in the direction crossing or transverse to the thickness direction scratches the first inorganic protective layer, the first inorganic protective layer may be dragged by the solid drying agent and slide on the organic sacrifice layer. This may cause the organic sacrifice layer to become indented or otherwise deformed. In this case also, the second electrode is unlikely to move together with the solid drying agent owing to the deformation of the organic sacrifice layer. Accordingly, since the second electrode in the organic EL element is unlikely to slide, it is possible to prevent the organic EL layer from becoming deformed. Therefore, even in the case that the particle solid drying agent is dispersed in the filler, it is possible to prevent the organic EL element from being damaged by the solid drying agent, and the organic EL display device can be manufactured with a good yield.

The organic sacrifice layer may include at least one of the organic materials included in the organic EL layer. In this case, the organic sacrifice layer can be formed at a low cost.

The first inorganic protective layer may include a conductive layer constituted by the conductive materials included in the second electrode. In this case, the first inorganic protective layer can be formed at a low cost.

The first inorganic protective layer may include at least one of a silicon oxide layer, a silicon nitride oxide layer, a silicon nitride layer, a titanium oxide layer, and an aluminum oxide layer. In this case, a fine insulating layer can be included in the first inorganic protective layer. The insulating layer may be configured to prevent the solid drying agent from penetrating through the first inorganic protective layer and the organic sacrifice layer, so that the solid drying agent does not migrate to the organic EL element.

The solid drying agent may include at least one of alkali earth metal oxide and alkali earth metal chloride. The solid drying agent may exhibit a water-capturing property.

In some example embodiments, the organic EL display device may further comprise a second inorganic protective layer covering the display part, wherein the filler layered on the organic EL element in a thickness direction of the first substrate may be located between the second inorganic protective layer and the first substrate. In this case, the second inorganic protective layer may be configured to prevent any moisture included in the filler from being transferred to the organic EL element.

A thickness of the organic sacrifice layer may be not less than 10 nm and not more than 200 nm. In this case, the stress due to the solid drying agent applying to the organic EL element can be relaxed by the organic sacrifice layer.

A thickness of the first inorganic protective layer may be not less than 50 nm and not more than 300 nm. In this case, it is possible to prevent the solid drying agent penetrating through the first inorganic protective layer. Moreover, adverse effects on an electro-optic property and lifetime of the organic EL element caused by the first inorganic protective layer can be prevented.

DETAILED DESCRIPTION

Hereinafter, a description is given of embodiments according to the present disclosure referring to the attached drawings. In the following description, the same components or components having the same function are designated by the same reference sign, and a duplicated description is omitted. Whereas some of the materials or layers of the display device are described below as being "located on" or "layered on" each other, for example a first layer located on a second layer, this is not intended to necessarily require contact between the two layers. Rather, in some example embodiments an intervening layer(s) or material(s) may be located between the first layer and the second layer.

Figure 1:
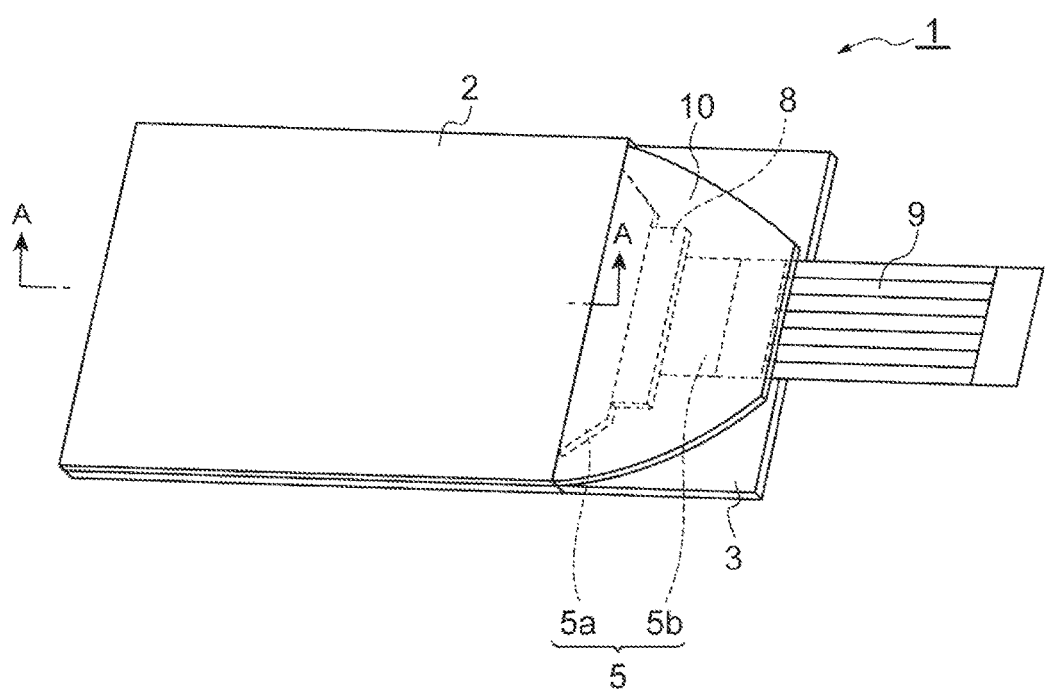
FIG. 1 is a schematic plan view of an organic EL display device according to an embodiment.
Figure 2:
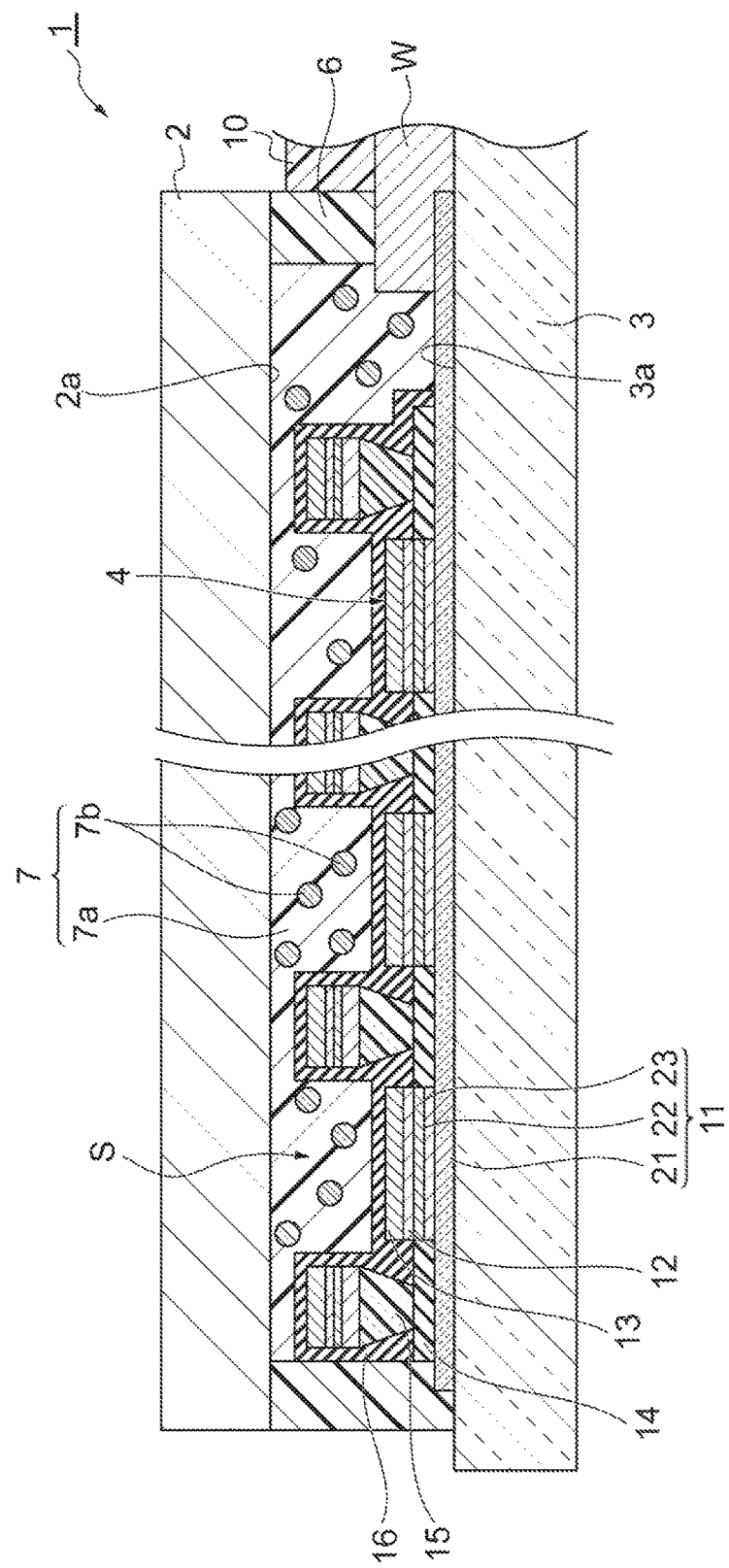
FIG. 2 is a schematic sectional view taken along a line A-A in FIG. 1.
Figure 3:
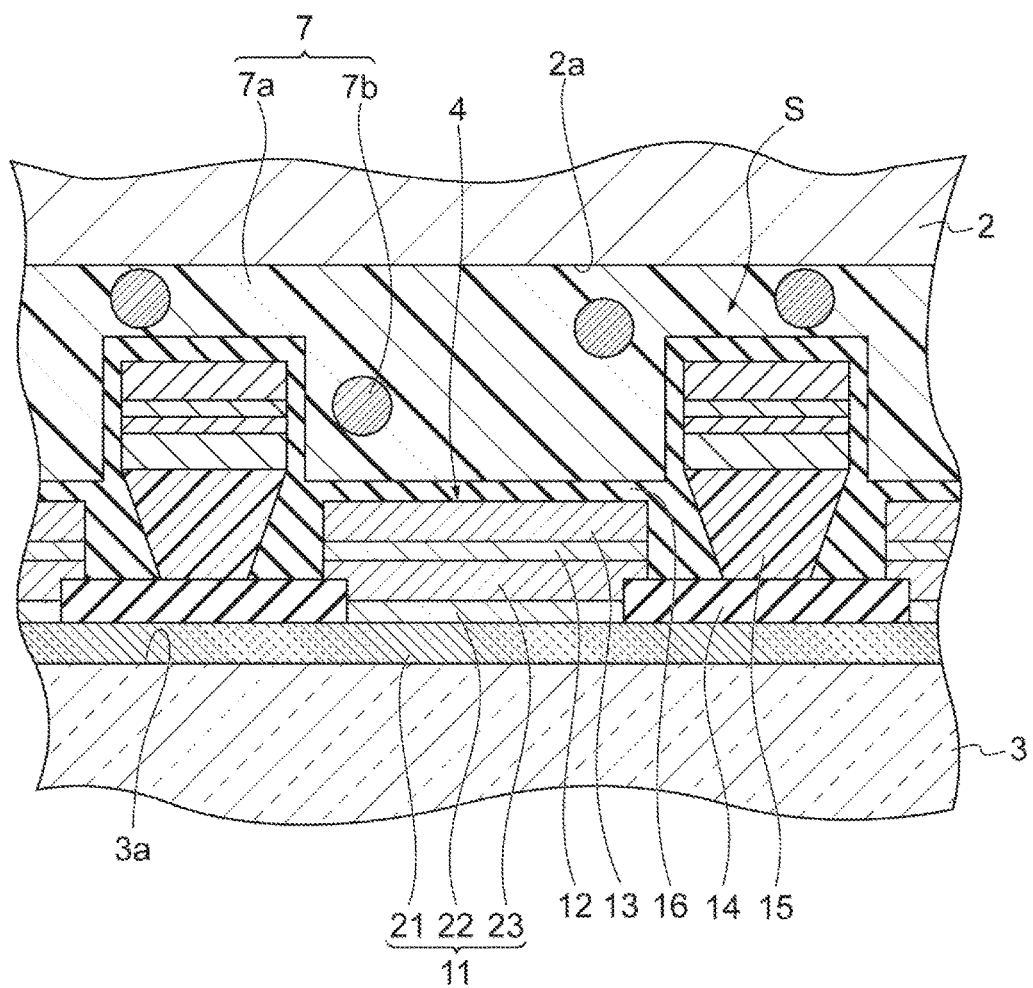
FIG. 3 is an enlarged partial view of FIG. 2.

A description is given of a configuration of an organic EL display device with reference to FIG. 1 to FIG. 3. FIG. 1 is a schematic plan view of the organic EL display device. FIG. 2 is a schematic sectional view taken along a line A-A in FIG. 1. FIG. 3 is an enlarged partial view of FIG. 2.

As illustrated in FIG. 1 to FIG. 3, an organic EL display device 1 may comprise a passive matrix display device. The organic EL display device 1 includes a first substrate 2 and a second substrate 3 which are stacked to each other, a display part 4, a wiring part 5, a frame-shaped sealing layer 6, a filler 7, an integrated circuit 8, an FPC 9 (flexible printed circuit board), and a protective resin 10. Hereinafter, a description is given with the direction in which the first substrate 2 and the second substrate 3 are stacked to each other being referred to merely as a "stacked direction". The stacked direction corresponds to a thickness direction of the first substrate 2 and the second substrate 3.

The first substrate 2 serves as a sealing substrate and is provided to face the second substrate 3. The first substrate 2 comprises, for example, a glass substrate, a ceramics substrate, a metal substrate, a plastic substrate, or any combination thereof. The first substrate may have flexibility. A main surface 2a (first main surface) of the first substrate 2 facing the second substrate 3 has a substantially rectangular shape. An edge of the main surface 2a is in contact with the sealing layer 6.

The second substrate 3 may be formed into one body with the first substrate 2 via the sealing layer 6. Additionally, the display part 4 and the wiring part 5 may be located on the second substrate 3. The second substrate 3 may comprise, for example, a glass substrate or a flexible substrate (e.g., plastic substrate, etc.) having translucency. A main surface 3a (second main surface) of the second substrate 3 has a substantially rectangular shape similar to the main surface 2a, and faces the main surface 2a. Short sides of the main surface 3a are substantially the same in length as short sides of the main surface 2a, and long sides of the main surface 3a are longer than long sides of the main surface 2a. Accordingly, if the short sides on one side of the main surfaces 2a and 3a are aligned, a part of the main surface 3a is exposed from the first substrate 2. A distance between the main surfaces 2a and 3a in the stacked direction is 10 μm to 30 μm, for example. Note that the phrase "substantially the same as" in the embodiments represents a concept not only expressing being fully identical but also encompassing a slight difference (e.g., up to around several %).

The display part 4 is configured to emit a light by being supplied with a current, and is located on the main surface 3a of the second substrate 3. The display part 4 is provided within a sealed space S which is surrounded and sealed by the first substrate 2, the second substrate 3, and the sealing layer 6. The display part 4 includes a plurality of organic EL elements 11 arranged in a matrix, an organic sacrifice layer 12 located on and in contact with each organic EL element 11, a first inorganic protective layer 13 located on and in contact with the organic sacrifice layer 12, an insulating film 14 provided to surround the organic EL element 11 seen in the stacked direction, and an element separator 15 located on the insulating film 14.

Each organic EL element 11 is configured to emit a light by being supplied with a current, and is located on the main surface 3a of the second substrate 3. The organic EL element 11 has a first electrode 21, an organic EL layer 22, and a second electrode 23 stacked in order from the main surface 3a.

The first electrode 21 may comprise a transparent conductive layer serving as an anode, that extends along a long side direction (e.g. length or longitudinal direction) of the main surface 3a. Examples of materials constituting the first electrode 21 include a conductive material having translucency such as ITO (indium tin oxide) and IZO (indium zinc oxide). The first electrode 21 may be formed by patterning a transparent conductive film formed on the main surface 3a. In some example embodiments, the first electrode 21 is formed by, for example, a PVD method (physical vapor deposition) such as a vacuum deposition method and a sputtering method.

The organic EL layer 22 includes at least an organic light emitting layer including a light emitting material. The organic EL layer 22 may have, in addition to the organic light emitting layer, an electron injection layer, an electron transport layer, a hole transport layer, a hole injection layer, and the like. The light emitting material may be a low-molecular organic compound or a high-molecular organic compound. A fluorescent material or a phosphorescence material may be used as the light emitting material. The electron injection layer, the electron transport layer, the hole transport layer, and the hole injection layer each contain an organic material. For example, the hole transport layer contains α-NPD that is a low-molecular organic compound showing a hole transport property, and the electron transport layer contains $Alq_3$ that is a low-molecular organic compound showing an electron transport property. A thickness of the organic EL layer 22 is not less than 100 nm and not more than 300 nm, for example. The organic EL layer 22 is formed by the PVD method, for example.

The second electrode 23 is a conductive layer serving as a cathode, and extends along a direction of the short side (e.g. width or lateral direction) of the main surface 3a. Example of materials (conductive materials) constituting the second electrode 23 include metal such as aluminum, and silver. Example of the conductive materials may include alkali earth metal (magnesium, calcium, etc.) or may include a material having translucency such as IZO (indium zinc oxide) and ITO (indium tin oxide). A plurality of conductive materials may be included in the conductive material. A thickness of the second electrode 23 is not less than 50 nm and not more than 300 nm, for example. The second electrode 23 is formed by the PVD method, for example.

The organic sacrifice layer 12 is an organic layer for protecting the organic EL element 11 from being damaged from the second electrode 23 side. A shape of the organic sacrifice layer 12 seen in the stacked direction is substantially the same as a shape of the second electrode 23. The organic sacrifice layer 12 includes at least one of the organic materials included in the organic EL layer 22, for example. In this case, the organic sacrifice layer 12 can be formed by a manufacturing apparatus for the organic EL element 11. In order to inexpensively and easily form the organic sacrifice layer 12, the organic sacrifice layer 12 may be constituted by the organic materials which are often contained in the organic EL element 11 in a large amount (e.g., α-NPD, $Alq_3$, etc.). A thickness of the organic sacrifice layer 12 is not less than 10 nm and not more than 200 nm, for example. In this case, the organic EL element 11 can be protected without providing an excessive amount of the organic sacrifice layer 12. The organic sacrifice layer 12 is formed by the PVD method similar to the organic EL layer 22.

The first inorganic protective layer 13 may be configured to prevent damage of the organic EL element 11 from the second electrode 23 side similar to the organic sacrifice layer 12. A shape of the first inorganic protective layer 13 seen in the stacked direction is substantially the same as the shape of the second electrode 23. The first inorganic protective layer 13 has at least one of an inorganic conductive layer and an inorganic insulating layer. In a case that the first inorganic protective layer 13 has an inorganic conductive layer, the inorganic conductive layer may be a conductive layer constituted by the conductive materials contained in the second electrode 23. In this case, the first inorganic protective layer 13 can be formed by the manufacturing apparatus, for the organic EL element 11. In a case that the first inorganic protective layer 13 has an inorganic insulating layer, the inorganic insulating layer may have at least one of a silicon oxide layer, a silicon nitride oxide layer, a silicon nitride layer, a titanium oxide layer, and an aluminum oxide layer. A thickness of the first inorganic protective layer 13 is not less than 50 nm and not more than 300 nm, for example. In this case, the organic EL element 11 can be protected without affecting an optical property and the like of the organic EL element 11. The first inorganic protective layer 13 is formed by the PVD method similar to the second electrode 23.

The insulating film 14 may be configured to provide a non-light-emitting part in the display part 4, or to prevent undesirable (unintended) short-circuiting between the first electrode 21 and the second electrode 23. The insulating film 14 may be an inorganic insulating film such as a silicon oxide film and a silicon nitride film, or an organic insulating film such as a polyimide film, a cycloolefin resin film, and an acrylic resin film, for example. A thickness of the insulating film 14 is not less than 50 nm and not more than 3000 nm (3 μm), for example. The insulating film 14 is provided after the first electrode 21 is formed and before the organic EL layer 22 is formed.

The element separator 15 may comprise an insulating material configured to separate the second electrodes 23 from each other in the display part 4. The element separator 15 extends along the direction of the short side of the main surface 3a, and has an inverse tapered shape in cross-section. The element separator 15 is provided after the insulating film 14 is formed and before the organic EL layer 22 is formed. Accordingly, the organic EL layer 22 and the second electrode 23 may have a desired shape owing to the element separator 15 by forming the organic EL layer 22 and the second electrode 23 through the PVD method after forming the element separator 15. Similarly, the organic sacrifice layer 12 and the first inorganic protective layer 13 each have a shape similar to the organic EL layer 22 and the second electrode 23, seen in the stacked direction. The element separator 15 includes a negative type photosensitive resin, for example.

In the sealed space S, a second inorganic protective layer 16 is provided to cover the display part 4. The second inorganic protective layer 16 is provided in order to protect the organic EL element 11, the organic sacrifice layer 12, and the first inorganic protective layer 13, and to prevent moisture intrusion into the organic EL element 11. The second inorganic protective layer 16 is an inorganic insulating layer. The second inorganic protective layer 16 may have at least one of a silicon oxide layer, a silicon nitride oxide layer, a silicon nitride layer, a titanium oxide layer, and an aluminum oxide layer. A thickness of the second inorganic protective layer 16 is not less than 10 nm and not more than 300 nm, for example. In this case, the second inorganic protective layer 16 may protect the organic EL element 11 and the like as well as the second inorganic protective layer 16 can prevent the moisture from intruding into the organic EL element 11. The second inorganic protective layer 16 is formed by the PVD method, for example.

The wiring part 5 includes a plurality of routing wirings, and has a first area 5a and a second area 5b. The first area 5a is provided with a routing wiring W which connects the display part 4 with the integrated circuit 8. The routing wiring W includes a molybdenum alloy layer, an aluminum alloy layer, and a molybdenum alloy layer stacked in order, for example. The routing wiring W may be formed at the same time as the first electrode 21 or second electrode 23 of the organic EL element 11. The second area 5b is provided with a routing wiring (not illustrated) that connects the integrated circuit 8 with the FPC 9, and that is formed at the same time as the routing wiring W. The wiring part 5 may be provided with a barrier film for protecting the above routing wirings. The barrier film is an insulating film such as a silicon oxide film and a silicon nitride film, for example. This barrier film may be formed at the same time as the insulating film 14.

The sealing layer 6 serves as an attaching material for coupling the first substrate 2 with the second substrate 3, and serves as a lateral wall for defining the sealed space S. The sealing layer 6 is provided along an edge on the main surface 2a of the first substrate 2, and is in contact with the edge thereon and the main surface 3a of the second substrate 3. The sealing layer 6 is also in contact with the routing wirings constituting the wiring part 5 (e.g., the routing wiring W provided to the first area 5a). The sealing layer 6 has a rectangular frame shape along the edge of the main surface 2a seen in the stacked direction. The sealing layer 6 includes an ultraviolet curable resin having adhesiveness, for example. The sealing layer 6 may include a spacer or the like such as glass fibers, silica particles, resin balls and the like.

The filler 7 is housed within the sealed space S to fill a space in the sealed space S. The filler 7 may fill the sealed space S with no void. The filler 7 layered on the organic EL element 11 in the stacked direction is located between the second inorganic protective layer 16 and the first substrate 2. The filler 7 contains a base material 7a and a particulate solid drying agent 7b dispersed in the base material 7a. In order to control the level of viscosity, the base material 7a may comprise one or more curable resins, for example. Examples of the base material 7a include a silicone resin, and an acrylic resin. The solid drying agent 7b includes at least one of alkali earth metal oxide and alkali earth metal chloride, for example. Examples of alkali earth metal oxide include magnesium oxide (MgO), calcium oxide (CaO), and strontium oxide (SrO). Examples of alkali earth metal chloride include calcium chloride, and magnesium chloride. The solid drying agent 7b may be constituted by a plurality of particles. For example, the solid drying agent 7b may be a combination of alkali earth metal oxide particles and alkali earth metal chloride particles, and may contain a plurality of kinds of alkali earth metal oxide particles. A ratio of the solid drying agent 7b to the filler 7 is not less than 30 mass % and not more than 60 mass %. In this case, it is possible to prevent moisture intrusion into the organic EL element 11 and to prevent damage to the organic EL element 11 due to the solid drying agent 7b. In addition, the probability of aggregation of the solid drying agent 7b in the base material 7a can be reduced. An average particle diameter of the solid drying agent 7b is not less than 0.1 μm and not more than 2 for example. A liquid drying agent including metal alkoxide as a water-capturing component may be included in the filler 7.

The integrated circuit 8 is a driver circuit controlling light-emitting or light-non-emitting of each organic EL element 11. The integrated circuit 8 is mounted on an area exposed from the first substrate 2 on the main surface 3a of the second substrate 3, and is connected with the wiring part 5. The integrated circuit 8 is an IC chip or the like, for example. The number of integrated circuits 8 mounted on the main surface 3a may be one or more.

The FPC 9 is connected with the routing wiring of the second area 5b in the wiring part 5, and is a wiring for connecting the organic EL display device 1 with an external device. The FPC 9 is formed using a flexible plastic substrate, for example. The external device connected with the FPC 9 is a power source, a current control circuit and the like, for example.

The protective resin 10 is configured to protect the wiring part 5 and integrated circuit 8 which are outside the sealed space S. The protective resin 10 is deposited on an area on the main surface 3a which is not covered by the first substrate 2. The protective resin 10 may comprise one or more curable resins, for example.

Figure 4A:
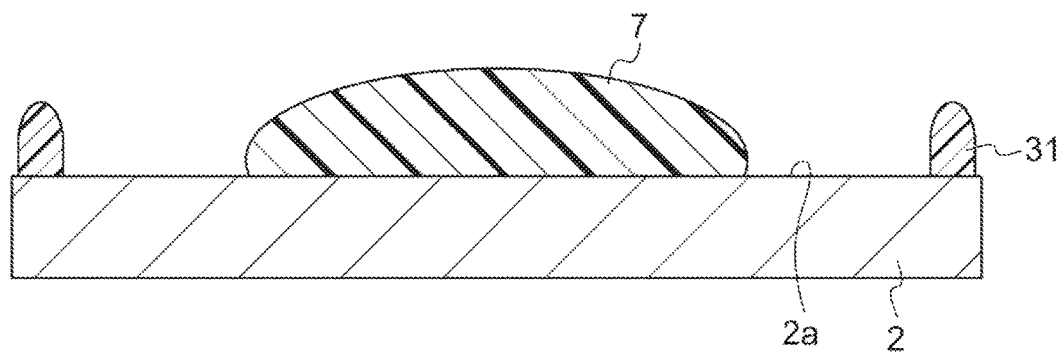
FIG. 4A to FIG. 4C are each a schematic view for illustrating a method of filling a filler.
Figure 4B:
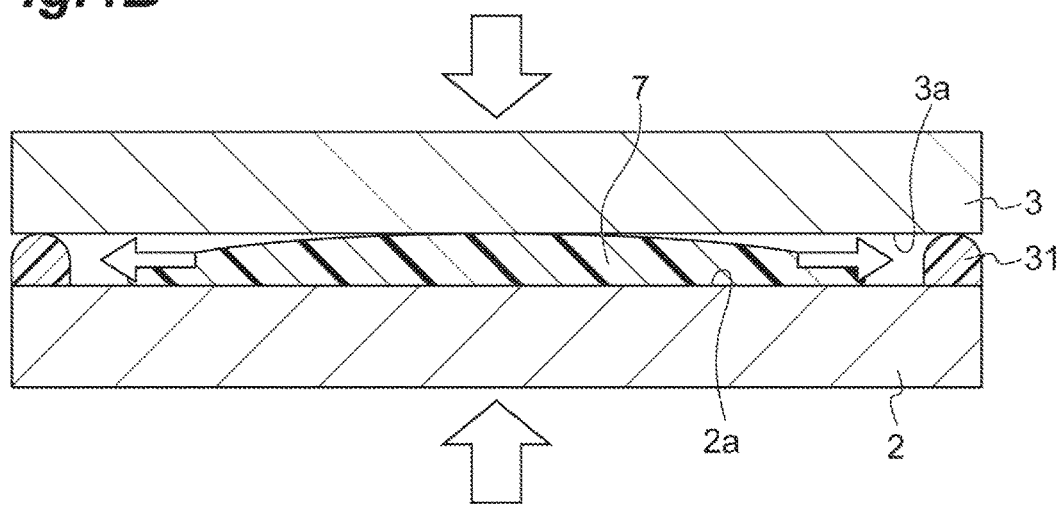
Figure 4C:
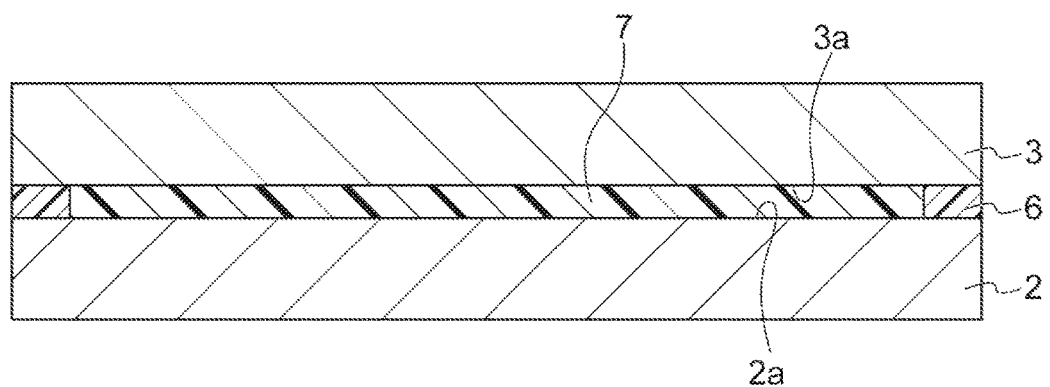

Next, a description is given of a method of filling the filler 7 through an ODF (One Drop Filling) method with reference to FIG. 4A to FIG. 4C. FIG. 4A to FIG. 4C are each a schematic view for illustrating a method of filling a filler. Note that, in the description of this filling method, the display part 4, the wiring part 5, the integrated circuit 8, and the FPC 9 are omitted for purposes of simplifying the description.

First, as illustrated in FIG. 4A, the first substrate 2 provided with an adhesive 31 is prepared. In some example embodiments, the adhesive 31 becomes the sealing layer 6 in a later step of the method. The adhesive 31 is provided to have a rectangular frame shape on the main surface 2a of the first substrate 2. Next, the filler 7 is dropped on the main surface 2a of the first substrate 2. The filler 7 is dropped in an area surrounded by the adhesive 31 on the main surface 2a. The number of places where the filler 7 is dropped on the main surface 2a may be one or more.

Then, as illustrated in FIG. 4B, the second substrate 3 is layered or located on the first substrate 2 prior to being sealed in a low pressure state or vacuum state. A pressure is applied to each of the first substrate 2 and the second substrate 3 to decrease a distance between the first substrate 2 and the second substrate 3 in the stacked direction. As a result, the filler 7 spreads toward an adhesive 31 side while filling the voids in the sealed space S. Accordingly, as illustrated in FIG. 4C, the filler 7 fills the sealed space S with no void. After attaching the second substrate 3 to the first substrate 2, the adhesive 31 is irradiated by an ultraviolet light in an atmospheric pressure state and the adhesive 31 is heated to form the sealing layer 6. At this time, the filler 7 may be cured.

Figure 5:
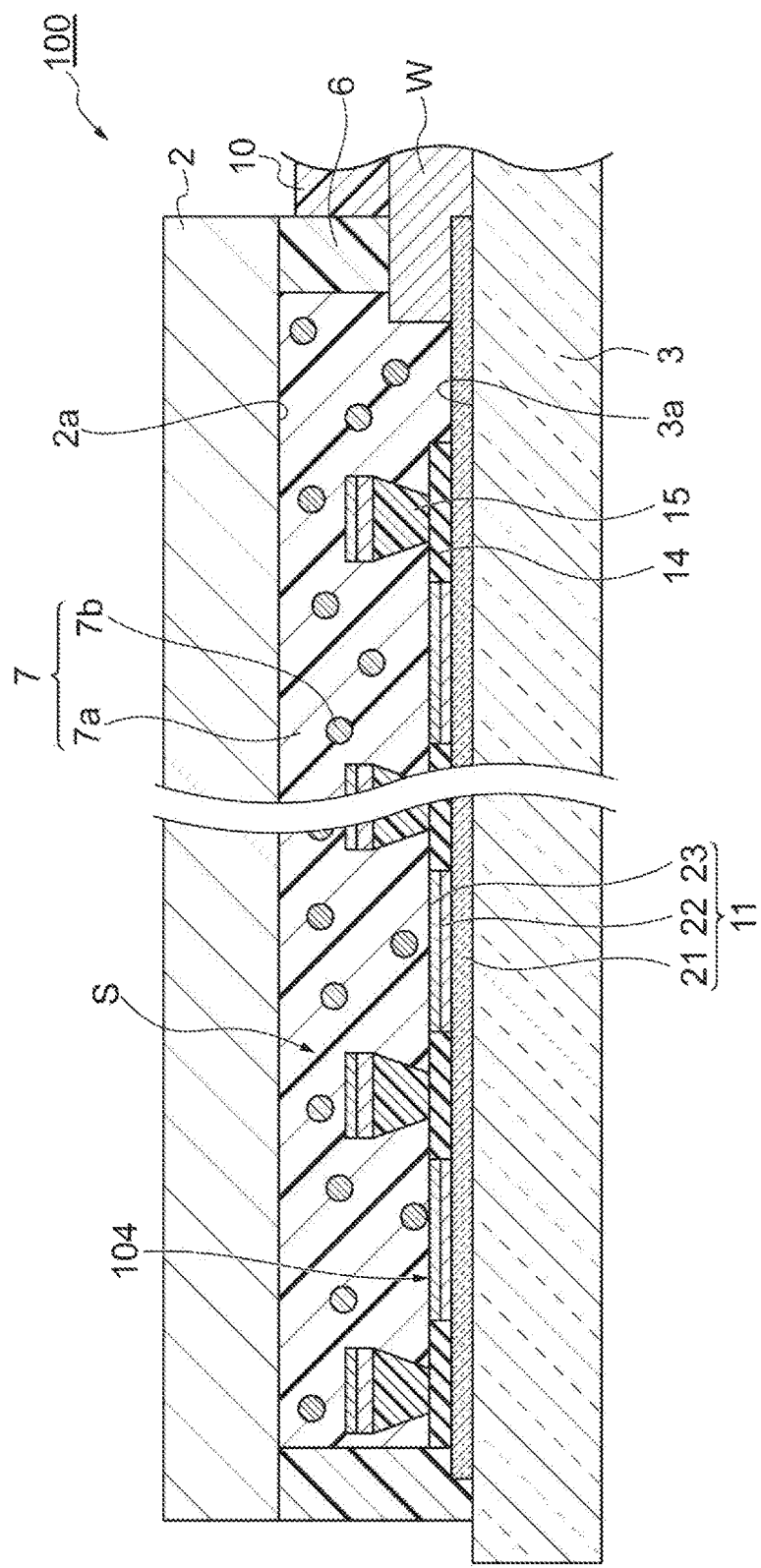
FIG. 5 is a schematic sectional view of an organic EL display device according to a comparison example.
Figure 6A:
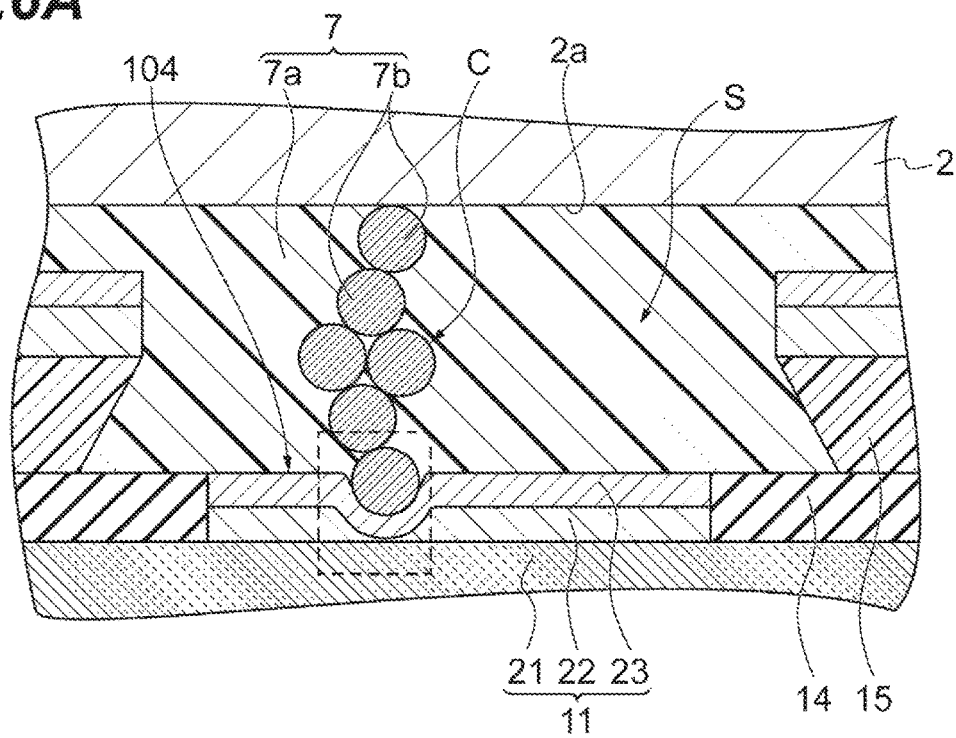
FIG. 6A is an enlarged partial view of FIG. 5.
Figure 6B:
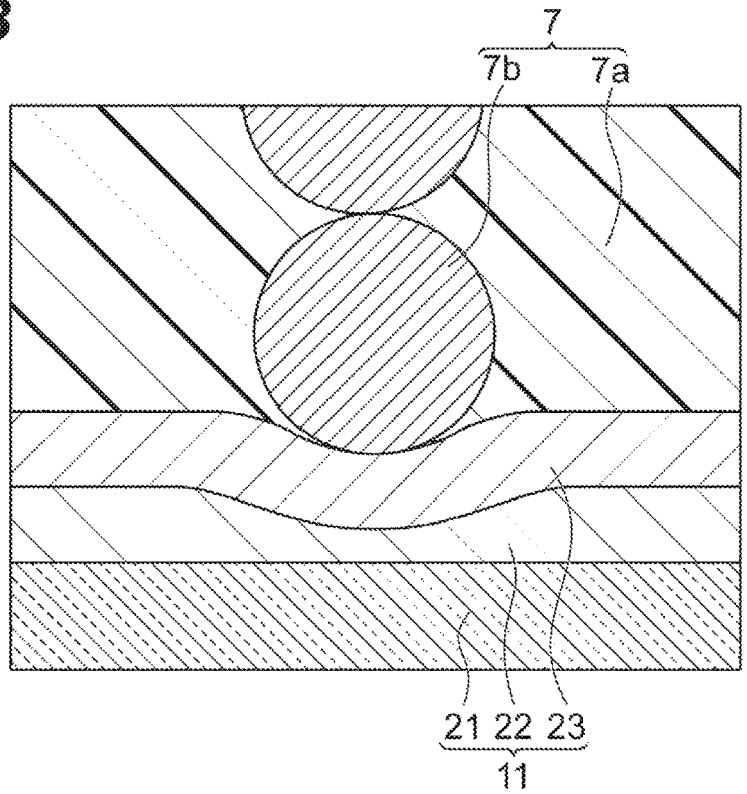
FIG. 6B is a further enlarged view of a portion of FIG. 6A surrounded by a broken line.
Figure 7A:
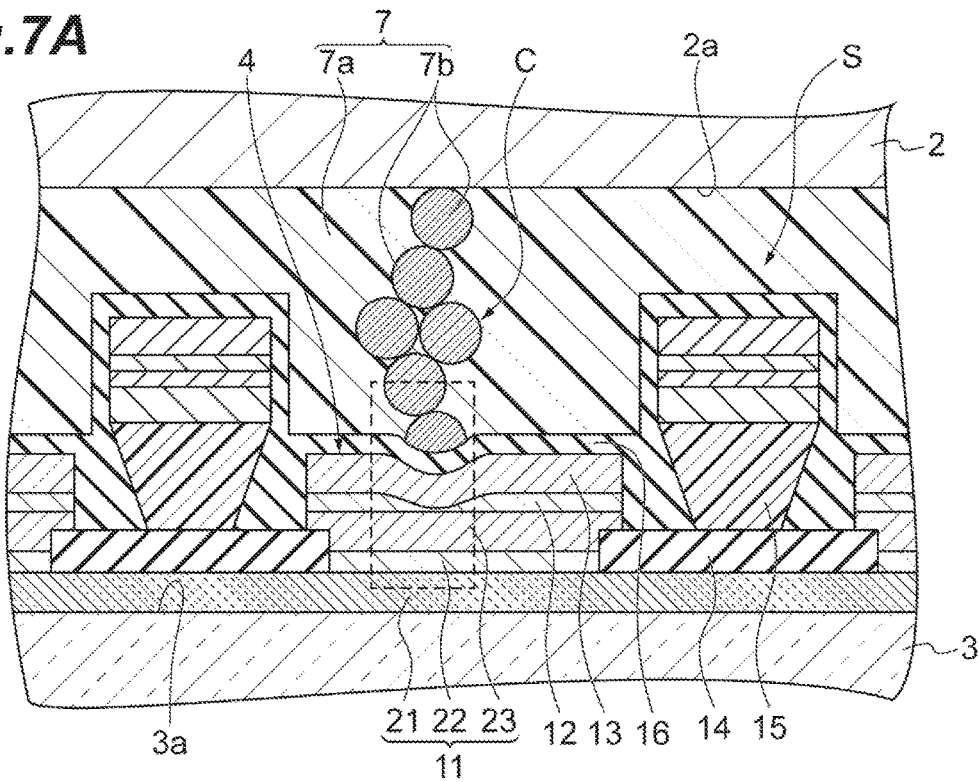
FIG. 7A is an enlarged sectional view of the organic EL display device.
Figure 7B:
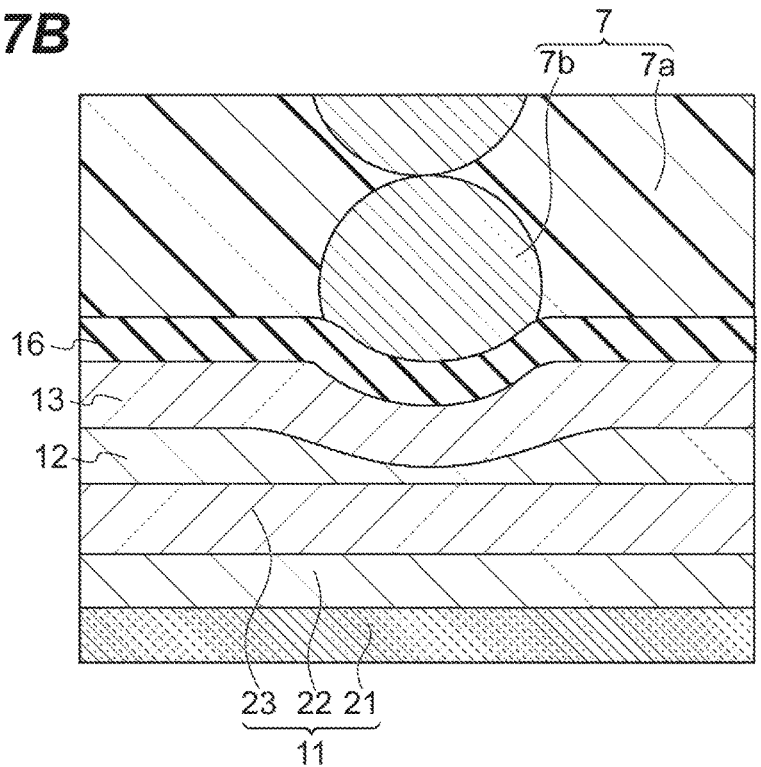
FIG. 7B is a further enlarged view of a portion of FIG. 7A surrounded by a broken line.

Next, referring to FIG. 5 to FIG. 7B, a description is given of an action and effect exerted by the organic EL display device 1 according to one or more embodiments, as compared with a comparison example. FIG. 5 is a schematic sectional view of an organic EL display device according to a comparison example. FIG. 6A is an enlarged partial view of FIG. 5, and FIG. 6B is a further enlarged view of a portion of FIG. 6A surrounded by a broken line. FIG. 7A is a partial enlarged sectional view of the organic EL display device according to the embodiments, and FIG. 7B is a further enlarged view of a portion of FIG. 7A surrounded by a broken line.

As illustrated in FIG. 5, an organic EL display device 100 according to the comparison example has the same configuration as the example organic EL display device 1 except that an organic sacrifice layer and a first inorganic insulating layer are not provided in the display part 104, and a second inorganic insulating layer covering the display part 104 is not provided. Accordingly, in the comparison example, the filler 7 containing the solid drying agent 7b is provided in the sealed space S.

The solid drying agent 7b dispersed in the base material 7a in the filler 7 may aggregate. For example, as illustrated in FIG. 6A, an aggregate C of the solid drying agent 7b having a sufficient size to make contact with both the organic EL element 11 in the display part 104 and the main surface 2a of the first substrate 2 may be contained in the filler 7. The aggregate C may be in contact with a surface of the organic EL element 11 (that is, a surface of the second electrode 23) when filling the filler 7, and then the surface thereof may be damaged due to the aggregate C. When the first substrate 2 and the second substrate 3 are coupled via the sealing layer 6, the aggregate C in contact with the first substrate 2 may press against the organic EL element 11. The aggregate C in contact with the first substrate 2 may move in a direction crossing or transverse to the stacked direction to scratch the second electrode 23.

In addition, the thermal expansion coefficients of some or all of the members constituting the organic EL display device 1 may be different from a thermal expansion coefficient of the solid drying agent 7b. Accordingly, when cooling the material after a heating process has been performed in order to form the sealing layer 6, for example, a stress caused by the above difference in the thermal expansion coefficients may be generated on an interface of the solid drying agent 7b. When the solid drying agent 7b is in contact with the organic EL element 11, the stress is generated between the solid drying agent 7b and the organic EL element 11. Owing to this stress, the solid drying agent 7b may press against the organic EL element 11, or the solid drying agent 7b may scratch the second electrode 23. Further, when the organic EL display device 1 is used, the organic EL element 11 generates heat. Accordingly, the solid drying agent 7b may press against the organic EL element 11, or the solid drying agent 7b may scratch the second electrode 23, not only when manufacturing the organic EL display device 1, but also when using the organic EL display device 1.

As described above, the second electrode 23 and the organic EL layer 22 may be compressed by the solid drying agent 7b (or the aggregate C) that is pressing against the organic EL element 11 as illustrated in FIG. 6B. Here, the organic compound included in the organic EL layer 22 is accumulated by the van der Waals' force, whereas the metal contained in the second electrode 23 is generally accumulated by metal bonding indicating a bonding force stronger than the van der Waals' force. Accordingly, since a density and strength of the organic EL layer 22 is likely to be smaller than the second electrode 23 that is an inorganic conductive layer, the organic EL layer 22 is more likely to be compressed and deformed than the second electrode 23. Moreover, a bonding force between the organic EL layer 22 and the second electrode 23 is weak. Accordingly, when the solid drying agent 7b (or the aggregate C) moves to scratch the second electrode 23, the second electrode 23 may be dragged by the solid drying agent 7b and slide on the organic EL layer 22. At this time, a stress may concentrate on a part of the second electrode 23 that slides, causing the organic EL layer 22 to deform. If the organic EL layer 22 in the organic EL element 11 is damaged due to the scratching or deformation, the first electrode 21 and the second electrode 23 may contact each other. This may increase a leakage current due to the organic EL element 11, or generate short-circuiting between the first electrode 21 and the second electrode 23, or the like. In this case, a so-called pinhole may be formed in the display part 4.

In the comparison example, in order to prevent the damage of the organic EL element 11, a protective film which is harder than the solid drying agent 7b may be provided on the organic EL element 11, or a protective film having a thickness of several micrometers may be provided on the organic EL element 11, for example. However, in the former case, the harder protective film may cause a stress to be applied to the organic EL element 11. This may result in an adverse effect on an electro-optic property and lifetime of the organic EL element 11. In the latter case, since additional time is taken in order to form the protective film with a sufficient thickness, productivity of the organic EL display device 1 decreases and a manufacturing cost of the organic EL display device 1 significantly increases.

In contrast, the organic EL display device 1 according to one or more embodiments includes the organic sacrifice layer 12 located on and contact with the second electrode 23, and the first inorganic protective layer 13 located on and contact with the organic sacrifice layer 12, as illustrated in FIGS. 7A and 7B. The filler 7 layered on the organic EL element 11 in the stacked direction is located between the first inorganic protective layer 13 and the first substrate 2. Accordingly, since the solid drying agent 7b dispersed in the filler 7 is prevented from directly contacting the organic EL element 11, it is possible to prevent the solid drying agent 7b from damaging the surface of the second electrode 23. The organic sacrifice layer 12 and the first inorganic protective layer 13 are stacked in order (e.g., sequentially) in the stacked direction between the organic EL element 11 and the filler 7. Therefore, when the solid drying agent 7b presses against the first inorganic protective layer 13, the solid drying agent 7b compresses and deforms the organic sacrifice layer 12 via the first inorganic protective layer 13. This allows the stress due to the solid drying agent 7b to be relaxed by the organic sacrifice layer 12. Therefore, the organic EL layer 22 is unlikely to be compressed and deformed. In addition, in case the solid drying agent 7b moves in a direction crossing or transverse to the stacked direction to scratch the first inorganic protective layer 13, the first inorganic protective layer 13 slides on the organic sacrifice layer 12 and deforms the organic sacrifice layer 12. In this case, the second electrode 23 is unlikely to move together with the solid drying agent 7b owing to the deformation of the organic sacrifice layer 12. Accordingly, since the second electrode 23 in the organic EL element 11 is unlikely to slide, it is possible to prevent the organic EL layer 22 from becoming deformed. Therefore, even in the case that the particle solid drying agent 7b is dispersed in the filler 7, it is possible to prevent the organic EL element 11 from being damaged by the solid drying agent 7b, and the organic EL display device 1 can be manufactured with a good yield. Even when a solid foreign matter is contained in the filler 7, damage to the organic EL element 11 may be prevented by including the organic sacrifice layer 12 and the first inorganic protective layer 13, and the organic EL display device 1 can be manufactured with a good yield.

The organic sacrifice layer 12 may include at least one of the organic materials contained in the organic EL layer 22 in order to lower the manufacturing cost of the organic sacrifice layer 12. As a specific example, after manufacturing the organic EL element 11, the manufacturing apparatus for the organic EL element 11 is used to form the organic sacrifice layer 12 on the organic EL element 11 while maintaining the vacuum state, and thereby, the organic sacrifice layer 12 can be formed at a low cost.

The first inorganic protective layer 13 may include a conductive layer constituted by the conductive materials contained in the second electrode 23 in order to lower the manufacturing cost of the first inorganic protective layer 13. As a specific example, after manufacturing the organic EL element 11, the manufacturing apparatus for the organic EL element 11 is used to form the first inorganic protective layer 13 on the organic sacrifice layer 12 while maintaining the vacuum state, and thereby, the first inorganic protective layer 13 can be formed at a low cost.

The first inorganic protective layer 13 may include at least one of a silicon oxide layer, a silicon nitride oxide layer, a silicon nitride layer, a titanium oxide layer, and an aluminum oxide layer. A fine insulating layer can be contained in the first inorganic protective layer 13. The insulating layer may be configured to prevent the penetration or migration of the solid drying agent 7b through the first inorganic protective layer 13 and the organic sacrifice layer 12 to arrive at the organic EL element 11.

The solid drying agent 7b may include at least one of alkali earth metal oxide and alkali earth metal chloride. The solid drying agent 7b may exhibit a water-capturing, water-retention or water-absorption property.

The organic EL display device 1 includes the second inorganic protective layer 16 covering the display part 4, and the filler 7 layered on the organic EL element 11 in the stacked direction is located between the second inorganic protective layer 16 and the first substrate 2. Accordingly, the moisture included in the filler 7 can be reduced or prevented from arriving at the organic EL element 11 by the second inorganic protective layer 16.

In some example embodiments, the thickness of the organic sacrifice layer 12 is not less than 10 nm and not more than 200 nm. Accordingly, the stress due to the solid drying agent 7b applying to the organic EL element 11 can be relaxed by the organic sacrifice layer 12. In addition, the manufacturing cost for the organic EL display device 1 can be decreased.

In some example embodiments, the thickness of the first inorganic protective layer 13 is not less than 50 nm and not more than 300 nm. Accordingly, the solid drying agent 7b may be prevented from passing through the first inorganic protective layer 13. Moreover, adverse effects on the electro-optic property and lifetime of the organic EL element 11 caused by the first inorganic protective layer 13 can be prevented. In addition, the manufacturing cost for the organic EL display device 1 can be decreased.

Figure 8:
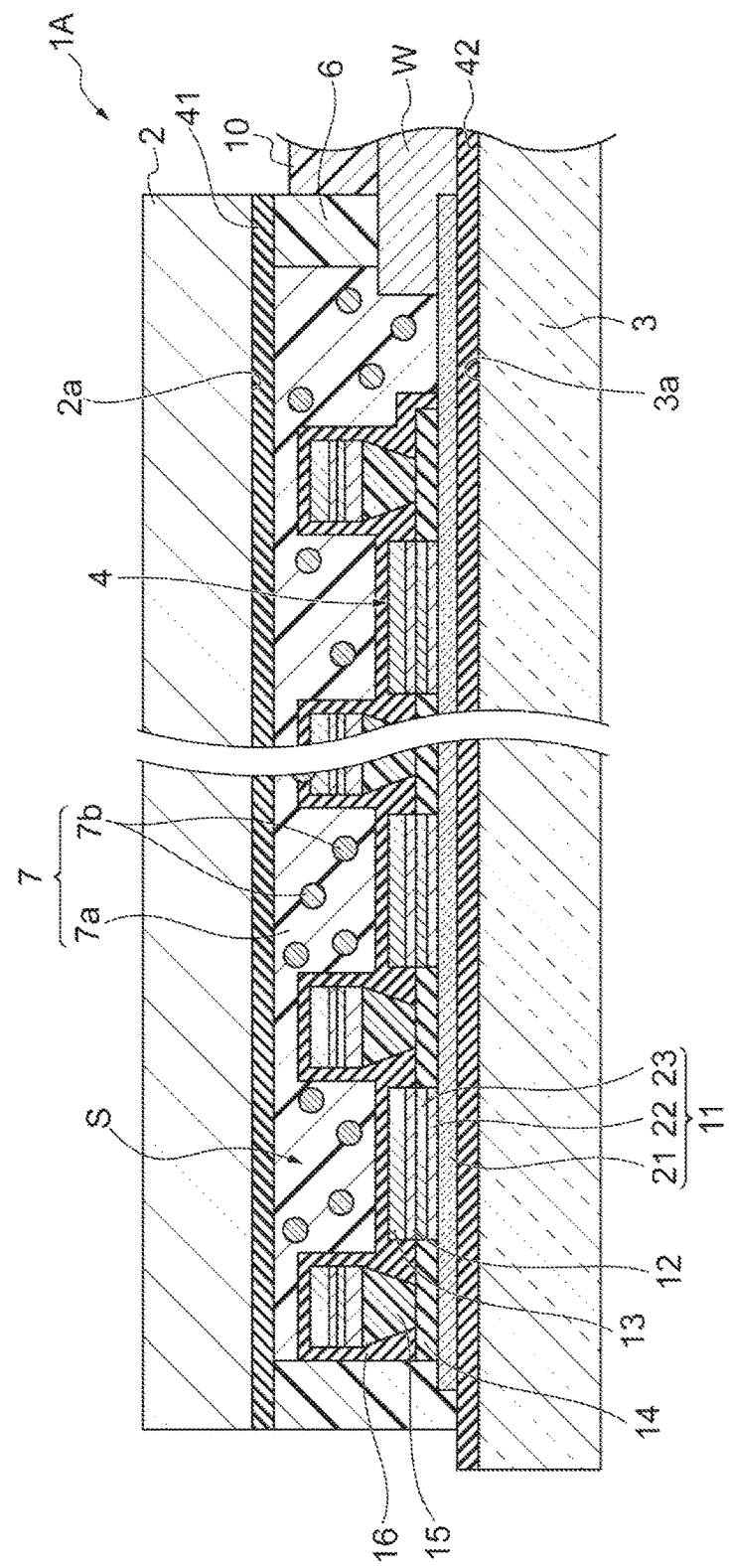
FIG. 8 is a schematic sectional view of an organic EL display device according to an example modification.

The organic EL display device according to the disclosure is not limited to the above described embodiments, and other various modifications may be adopted. FIG. 8 is a schematic sectional view of an organic EL display device according to an example modification. An organic EL display device 1A illustrated in FIG. 8 includes, in addition to the configuration of the organic EL display device 1 according to the above embodiments, a reinforcing film 41 in contact with the main surface 2a of the first substrate 2, and a reinforcing film 42 in contact with the main surface 3a of the second substrate 3. In view of preventing moisture permeability, each of the reinforcing films 41 and 42 may include at least one of a silicon oxide film, a silicon nitride film, a silicon nitride oxide film, and an aluminum oxide film, for example. In the example modification, the first substrate 2 and the second substrate 3 each have flexibility. Therefore, the reinforcing film 41 is provided in order to reinforce the first substrate 2, and the reinforcing film 42 is provided in order to reinforce the second substrate 3. Additionally, in such an example modification, an action and effect similar to the above described embodiments are exerted. Additionally, even in a case that the organic EL display device 1A comprises a flexible display, breakage of the first substrate 2 and second substrate 3 can be prevented.

In the above embodiments and the above example modification, the second inorganic protective layer 16 may not be provided in the sealed space S. In this case, the filler 7 layered on the organic EL element 11 in the stacked direction is located between the first inorganic protective layer 13 and the first substrate 2.

In the above embodiments and the above example modification, the organic EL display device is not limited to a passive matrix display device. For example, the organic EL display device may be an active matrix display device. In this case, transistors and the like corresponding to the respective organic EL elements are provided.

In the above embodiments and the above example modification, both the first substrate and the second substrate are not limited to a substantially rectangular shape seen in the stacked direction. For example, both the first substrate and the second substrate may have a polygonal shape, or a substantially circular shape seen in the stacked direction. Similarly, the sealing layer provided to the first substrate may have a polygonal frame shape, or a substantially annular shape seen in the stacked direction. Therefore, the sealing layer may have at least one corner or no corner.

It is to be understood that not all aspects, advantages and features described herein may necessarily be achieved by, or included in, any one particular example embodiment. Indeed, having described and illustrated various examples herein, it should be apparent that other examples may be modified in arrangement and detail. We claim all modifications and variations coming within the spirit and scope of the subject matter claimed herein.

What is claimed is:

1. A display device comprising:
    a first substrate including a first main surface;
    a frame-shaped sealing layer located on the first main surface and along an edge of the first substrate;
    a second substrate coupled with the first substrate via the sealing layer, the second substrate including a second main surface facing the first main surface;
    a display part located on the second main surface and within a sealed space surrounded and sealed by the first substrate, the sealing layer, and the second substrate; and
    a filler located in the sealed space and including a particle solid drying agent dispersed therein,
    wherein the display part comprises:
        an organic EL element located on the second main surface, the organic EL element including a first electrode, an organic EL layer, and a second electrode stacked in order from the second main surface;
        an organic sacrifice layer in contact with the second electrode; and
        a conductive inorganic protective layer in contact with the organic sacrifice layer, the conductive inorganic protective layer spatially separated from the organic EL element, and
    wherein the filler is located between the conductive inorganic protective layer and the first substrate.

2. The display device according to claim 1, wherein the organic sacrifice layer comprises at least one organic material included in the organic EL layer.

3. The display device according to claim 1, wherein the conductive inorganic protective layer comprises a conductive material included in the second electrode.

4. The display device according to claim 1, wherein the display part further comprises an inorganic protective layer including at least one layer selected from a silicon oxide layer, a silicon nitride oxide layer, a silicon nitride layer, a titanium oxide layer, and an aluminum oxide layer.

5. The display device according to claim 1, wherein the solid drying agent includes an alkali earth metal oxide or an alkali earth metal chloride.

6. The display device according to claim 1, further comprising:
    a second inorganic protective layer covering the display part, wherein the filler is located between the second inorganic protective layer and the first substrate.

7. The display device according to claim 1, wherein a thickness of the organic sacrifice layer is not less than 10 nm and not more than 200 nm.

8. The display device according to claim 1, wherein a thickness of the conductive inorganic protective layer is not less than 50 inn and not more than 300 nm.

9. The display device according to claim 1, further comprising a layer interposed between the second substrate and the organic EL element.

10. The display device according to claim 1, wherein the organic sacrifice layer is in contact with a top surface of the second electrode.

11. The display device according to claim 6, wherein the second inorganic protective layer is spatially separated from the organic EL layer.

12. A display device comprising:
a first substrate;
a sealing layer located along an edge of the first substrate;
a second substrate coupled with the first substrate via the sealing layer;
a display part located within a sealed space surrounded and sealed by the first substrate, the sealing layer, and the second substrate; and
a filler located in the sealed space and including a particle solid drying agent dispersed therein,
wherein the display part comprises:
a light emitting element,
an organic sacrifice layer located on and in contact with the light emitting element; and
a conductive inorganic protective layer located on and in contact with the organic sacrifice layer, the conductive inorganic protective layer spatially separated from the light emitting element, and
wherein the organic sacrifice layer and the conductive inorganic protective layer are interposed between the light emitting element and the filler.

13. The display device according to claim 12, wherein the light emitting element comprises an organic EL element, and wherein the organic sacrifice layer includes at least one organic material included in the organic EL element.

14. The display device according to claim 12, wherein the conductive inorganic protective layer comprises a conductive material included in the light emitting element.

15. The display device according to claim 12, further comprising:
a second inorganic protective layer covering the display part, wherein the organic sacrifice layer, the conductive inorganic protective layer, and the second inorganic protective layer are interposed between the light emitting element and the filler.

16. The display device according to claim 12, wherein the light emitting element includes a first electrode, a second electrode, and an organic EL layer interposed between the first electrode and the second electrode.

17. The display device according to claim 12, further comprising a reinforcing film interposed between the second substrate and the light emitting element, wherein the reinforcing film comprises a silicon compound or an oxide compound.

18. The display device according to claim 12, wherein the light emitting element comprises an organic EL element, and wherein the organic sacrifice layer is in contact with the organic EL element.

19. The display device according to claim 12, wherein the organic sacrifice layer is in contact with a top surface of the light emitting element.

20. The display device according to claim 15, wherein the light emitting element includes a first electrode, a light emitting layer on the first electrode, and a second electrode on the light emitting layer, and wherein the second inorganic protective layer is spatially separated from the light emitting layer.

21. A method of manufacturing a display device, comprising:
forming a sealing layer along an edge of a first substrate;
forming a light emitting element on a second substrate;
forming an organic sacrifice layer on the light emitting element;
forming a conductive inorganic protective layer on the organic sacrifice layer;
depositing a filler on the first substrate, wherein the filler includes a particle solid drying agent dispersed therein; and
sealing the first substrate to the second substrate via the sealing layer to form a sealed space which encloses the filler,
wherein the organic sacrifice layer is in contact with the light emitting element after the forming the organic sacrifice layer, and
wherein the conductive inorganic protective layer is in contact with the organic sacrifice layer and is spatially separated from the light emitting element after the conductive inorganic protective layer is formed.

22. The method according to claim 21, wherein forming the light emitting element comprises:
forming a first electrode on the second substrate;
forming an organic EL layer on the first electrode; and
forming a second electrode on the organic EL layer, wherein the organic sacrifice layer is in contact with the second electrode.

23. The method according to claim 21, wherein the filler is deposited on the first substrate within a frame shaped seal of the sealing layer by a drop filling method, and wherein sealing the first substrate to the second substrate comprises:
placing the second substrate against the sealing layer in a low pressure or vacuum state; and
decreasing a distance between the first substrate and the second substrate, causing the filler to spread throughout the sealed space.

24. The method according to claim 21, wherein the organic sacrifice layer is in contact with a top surface of the light emitting element.

25. The method according to claim 22, further comprising:
forming a second inorganic protective layer covering the light emitting element, the organic sacrifice layer, and the conductive inorganic protective layer, wherein the second inorganic protective layer is spatially separated from the organic EL layer.

* * * * *

UNITED STATES PATENT AND TRADEMARK OFFICE
CERTIFICATE OF CORRECTION

PATENT NO. : 10,476,030 B2
APPLICATION NO. : 16/003116
DATED : November 12, 2019
INVENTOR(S) : Shinji Ide et al.

It is certified that error appears in the above-identified patent and that said Letters Patent is hereby corrected as shown below:

In the Claims

Column 12, Line 62, Claim 8 cancel the text beginning with "The display device according to claim 1, wherein a thickness of the conductive inorganic protective layer" and ending "300 nm." in Column 12, Line 64, and insert the following claim:

--8. The display device according to claim 1, wherein a thickness of the conductive inorganic protective layer is not less than 50 nm and not more than 300 nm.--

Signed and Sealed this
Eleventh Day of February, 2020

Andrei Iancu
*Director of the United States Patent and Trademark Office*